(12) United States Patent
Sjoland et al.

(10) Patent No.: US 10,951,165 B2
(45) Date of Patent: Mar. 16, 2021

(54) SWITCHED CAPACITOR ARRANGEMENT FOR TUNING A DIFFERENTIAL CIRCUIT

(71) Applicant: Telefonaktiebolaget LM Ericsson (publ), Stockholm (SE)

(72) Inventors: Henrik Sjoland, Lund (SE); Torbjorn Sandstrom, Malmo (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/339,661

(22) PCT Filed: Oct. 7, 2016

(86) PCT No.: PCT/EP2016/074015
§ 371 (c)(1),
(2) Date: Apr. 4, 2019

(87) PCT Pub. No.: WO2018/065066
PCT Pub. Date: Apr. 12, 2018

(65) Prior Publication Data
US 2020/0052648 A1 Feb. 13, 2020

(51) Int. Cl.
*H03B 5/12* (2006.01)

(52) U.S. Cl.
CPC ......... *H03B 5/1265* (2013.01); *H03B 5/1215* (2013.01); *H03B 5/1228* (2013.01); *H03B 2200/005* (2013.01)

(58) Field of Classification Search
CPC .. H03B 5/1215; H03B 5/1265; H03B 5/1228; H03B 2200/005
See application file for complete search history.

(56) References Cited

U.S. PATENT DOCUMENTS 6,445,257 B1 9/2002 Cox et al.
9,520,829 B1 * 12/2016 Kim ..................... H03B 5/1293
(Continued)

FOREIGN PATENT DOCUMENTS

GB 2411061 A 8/2005
WO 2014006439 A1 1/2014

OTHER PUBLICATIONS

PCT International Search Report, dated Jun. 14, 2017, in connection with International Application No. PCT/EP2016/074015, all pages.
(Continued)

*Primary Examiner* — Jeffrey M Shin
(74) *Attorney, Agent, or Firm* — Patent Portfolio Builders PLLC

(57) ABSTRACT

A switched capacitor arrangement for tuning a differential circuit is disclosed. The switched capacitor arrangement comprises a first node, a second node and a third node. The switched capacitor arrangement further comprises a first capacitor coupled between the first node and the second node, a second capacitor coupled between the second node and the third node, and a first switch branch comprising a first switch coupled between the second node and a signal ground node. The first switch has an on state and an off state. The first node and third node are configured to be connected to respective differential nodes of the differential circuit. The switched capacitor arrangement is configured to tune the differential circuit by controlling the state of the first switch.

9 Claims, 6 Drawing Sheets

(56) References Cited

U.S. PATENT DOCUMENTS

| | | |
|---|---|---|
| 2008/0036550 A1 | 2/2008 | Yu |
| 2014/0077890 A1 | 3/2014 | Babaie et al. |
| 2016/0065131 A1 | 3/2016 | Pavao-Moreira et al. |
| 2016/0065225 A1* | 3/2016 | Pavao-Moreira .... H03B 5/1243 331/16 |
| 2016/0072463 A1 | 3/2016 | Camilleri |

OTHER PUBLICATIONS

PCT Written Opinion, dated Jun. 14, 2017, in connection with International Application No. PCT/EP2016/074015, all pages.
Henrik Sjoland, Improved Switched Tuning of Differential CMOS VCOs, IEEE Transactions on Circuits and Systems—II: Analog and Digital Signal Processing, vol. 49, No. 5, May 2002, pp. 352-355.
Janusz Groszkowski, "The Interdependence of Frequency Variation and Harmonic Content, and the Problem of Constant-Frequency Oscillators", Proceedings of the Institute of Radio Engineers, vol. 21, No. 7, Jul. 1933, pp. 958-981.
Luca Fanori et al., "3.3GHz DCO with a Frequency Resolution of 150Hz for All-Digital PLL", ISSCC 2010, Session 2, mm-Wave Beamforming & RF Building Blocks, 2.6, pp. 47-48.
Bodhisatwa Sadhu et al., "A Linearized, Low-Phase-Noise VCO-Based 25-GHz PLL With Autonomic Biasing", IEEE Journal of Solid-State Circuits, vol. 48, No. 5, May 2013, pp. 1138-1150.

\* cited by examiner

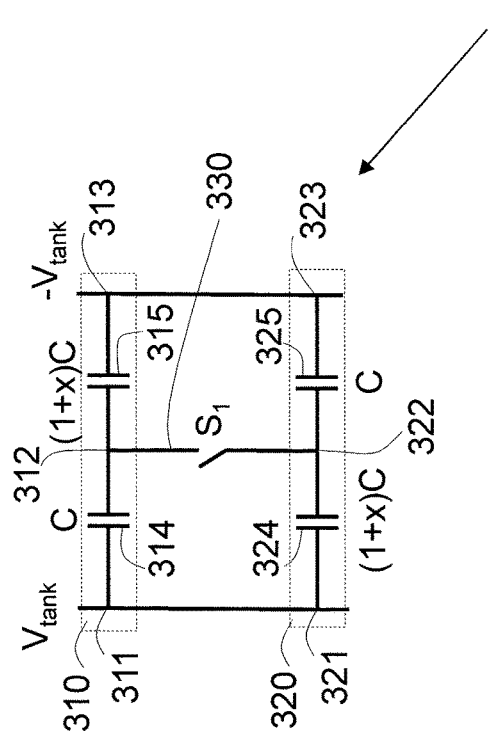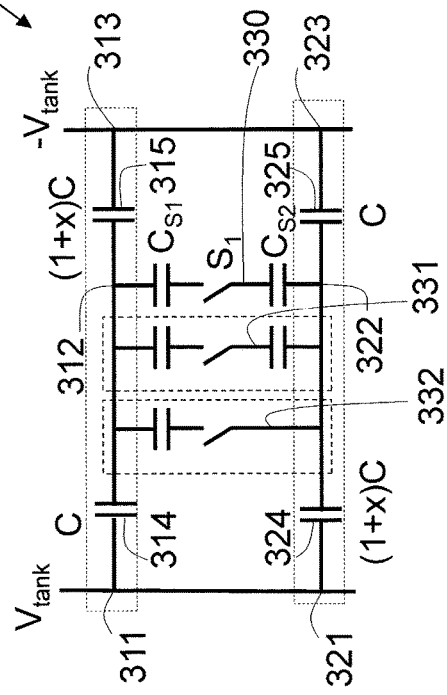
Fig. 3a
Fig. 3b

SWITCHED CAPACITOR ARRANGEMENT FOR TUNING A DIFFERENTIAL CIRCUIT

TECHNICAL FIELD

Embodiments herein relate to a switched capacitor arrangement for tuning a differential circuit. In particular, they relate to digital frequency tuning of a differential Digitally Controlled Oscillator, delay tuning of a digital to time converter, and frequency tuning of a differential digitally controlled filter in an electronic device, such as a frequency synthesiser, a transceiver, a wireless communication device, a base station, a mobile terminal.

BACKGROUND

Wireless communication systems usually comprise transceivers which comprise receivers and transmitters. The transmitters typically up-convert baseband signals to radio frequency (RF) signals for transmission, and the receivers down-convert received RF signals to baseband signals for processing. Such frequency conversion requires producing reliable mixing frequency signals, typically referred to as local oscillator (LO) signals, for use in an RF integrated circuit in a wireless communication device. Phase locked loops (PLLs) in frequency synthesizers are often used to provide such mixing frequency signals.

There is a strong trend towards more digital architectures in frequency synthesizers for local oscillator generation in transceivers. Some benefits are increased opportunities to use adaptive digital filters to obtain faster frequency changes without compromising signal quality, and possibility to use digital signal processing to mitigate effects of various impairments and disturbances. For high performance applications like transceivers in cellular communication systems, where low phase noise is required, all-digital phase locked loop (ADPLL) may be used.

A key building block in an ADPLL is the digitally controlled oscillator (DCO). For high performance applications, oscillators with inductor and capacitor (LC) tank are used, normally of a differential type as differential signals are preferred in integrated circuits. The key difference between a DCO and a voltage controlled oscillator (VCO) that is used in conventional PLLs is that the DCO has a digital frequency control input rather than a frequency control voltage input. This digital input will control the frequency by changing the effective capacitance in the LC tank. This is achieved by an arrangement of digitally controlled switch transistors selectively connecting a bank of capacitors to the tank. When a capacitor is connected to the oscillator tank, the frequency will take a step down. Under operation these steps must be very small not to degrade the signal quality. The very small frequency step corresponds to an extremely small capacitance being switched, for example 1aF. Further it must be possible to cover a large frequency range without an unpractically large number of steps. Several capacitor tuning banks are therefore normally used, with different ranges and resolution. FIG. 1 shows one example of a prior art DCO 100. The DCO 100 comprises a negative resistance circuit 110 which comprises a cross coupled differential pair of transistors to produce a negative resistance to compensate LC tank losses for generating the oscillation. The LC tank comprises inductor $L_{tank}$ and several banks of capacitors 120, 130, 140 for fine tuning, medium tuning and coarse tuning of the frequency controlled by respective digital control words F0, . . . Fn1, M0, . . . Mn2, C0, . . . Cn3.

Obtaining fine enough frequency resolution in the capacitor bank for frequency fine tuning is a challenge. Typically the required capacitance step is smaller than the smallest capacitor in a process design kit. To obtain such small capacitance steps the effective capacitance step seen at the LC tank must therefore be much smaller than the actual capacitance that is switched. This may be achieved in different ways, for example using a capacitive voltage divider before a switched capacitor to reduce the signal energy inside it. With less energy it will provide less effective capacitance. A problem is that such voltage dividers will use large sized components to sufficiently attenuate the signal, i.e. large capacitors are required to achieve high enough attenuation.

There is also a technique using tunable capacitive source degeneration for fine frequency tuning as discussed in L. Fanori etc. "*3.3 GHz DCO with a frequency resolution of 150 Hz for All-digital PLL*", IEEE ISSCC, pp. 48-49, 2010. In this solution, a bank of fine tuning capacitors is coupled between the source terminals of the differential pair transistors in the DCO. Although this technique provides attenuated voltage for the fine tuning capacitors, it reduces the transconductance of the differential pair transistors and thereby also the important loop gain of the DCO. Further, the frequency tuning sensitivity is non-linear and dependent on the transistor parameters.

SUMMARY

It is an object of embodiments herein to provide an improved circuit arrangement for digitally fine tuning of a differential circuit.

According to one aspect of embodiments herein, the object is achieved by a switched capacitor arrangement for tuning a differential circuit.

According to a first embodiment, the switched capacitor arrangement comprises a first node, a second node and a third node. The switched capacitor arrangement further comprises a first capacitor coupled between the first node and the second node, a second capacitor coupled between the second node and the third node, a first switch branch comprising a first switch coupled between the second node and a signal ground node. The first switch has an on state and an off state. The first node and third node are configured to be connected to respective differential nodes of the differential circuit. The switched capacitor arrangement is configured to tune the differential circuit by controlling the state of the first switch.

According to a second embodiment, the switched capacitor arrangement comprises a first capacitor branch. The first capacitor branch comprises a first node, a second node and a third node. The first capacitor branch further comprises a first capacitor coupled between the first node and the second node, a second capacitor coupled between the second node and the third node. The switched capacitor arrangement further comprises a second capacitor branch. The second capacitor branch comprises a first node, a second node and a third node. The second capacitor branch further comprises a third capacitor coupled between the first node and the second node, a fourth capacitor coupled between the second node and the third node. The switched capacitor arrangement further comprises a first switch branch comprising a first switch coupled between the second nodes of the first and second capacitor branches. The first switch has an on state and an off state. The first nodes and the third nodes of the first and second capacitor branches are configured to be connected to respective differential nodes of the differential circuit. The switched capacitor arrangement is configured to tune the differential circuit by controlling the state of the first switch.

The embodiments herein are based on using capacitive voltage dividers across a differential resonator of a differential circuit. Some advantages with the switched capacitor arrangements according to the embodiments herein are:

If two capacitors of equal size or nearly equal size are series connected between the differential nodes with positive and negative voltages of the resonator, the middle node will have a voltage close to zero. Therefore small signal voltages can be achieved without the need for large capacitor ratios.

The requirements on the switch may be considerably relaxed compared to switching a capacitance in a regular structure, i.e. direct connection of a switched capacitor across the differential circuit nodes, where the switch is in series with the capacitor. Since the voltage on the middle node is close to zero, the switch connected to the middle node according to embodiments herein will have considerable much less signal current flow in its on-state compared to the switch in the regular structure. The on-resistance may thus be higher in the switch for the same differential capacitor quality factor.

For the second embodiment, the switched capacitor arrangement is coupled to respective differential nodes of a differential circuit, and the switch is coupled between the middle nodes of two series connected capacitors. In this way, the switched capacitor arrangement is placed across the differential nodes of the differential circuit, i.e. not using any other nodes of the differential circuit which would introduce dependence on transistor parameters.

The tuning of a differential circuit, e.g. the frequency tuning of a DCO, may be controlled with high resolution, while still using a limited range of capacitor sizes, i.e. not smaller than existing capacitors in a design-kit, and not very large ones to save chip area.

Therefore embodiments herein provide improved circuit arrangements for digitally fine tuning of a differential circuit.

BRIEF DESCRIPTION OF THE DRAWINGS

Examples of embodiments herein are described in more detail with reference to attached drawings in which:

FIGS. 3a and 3b are schematic views illustrating switched capacitor arrangements according to embodiments herein.

DETAILED DESCRIPTION

To achieve a small capacitance control step in a circuit, e.g. a DCO, while still using a limited range of capacitor sizes, i.e. not smaller than existing capacitors in a design-kit, and not very large ones to save chip area, a capacitive voltage divider across differential nodes of a differential circuit may be used according to embodiments herein. In this way small signal voltages can be achieved without the need for large capacitor ratios. If two capacitors of equal size or nearly equal size are series connected between the positive and negative voltages of the differential circuit, the middle node will have a signal voltage close to zero. This may be exploited in different ways which lead to different embodiments.

Figure 1:
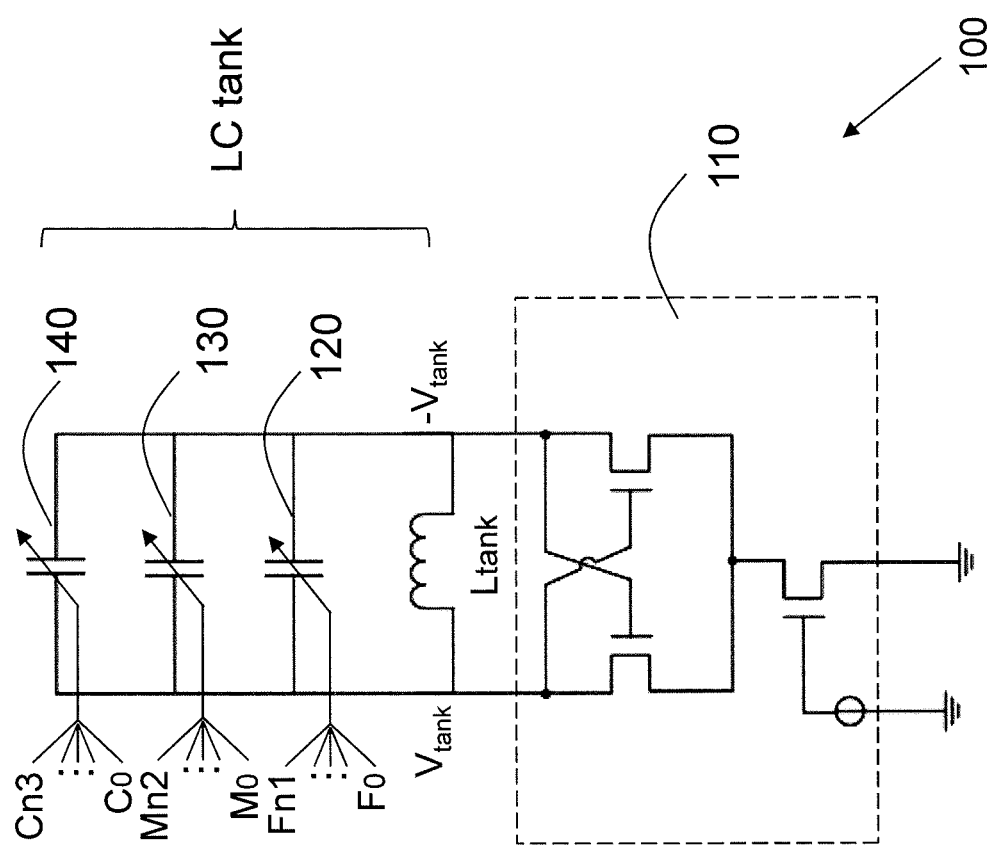
FIG. 1 is a schematic block view illustrating a basic structure of a DCO.
Figure 2A:
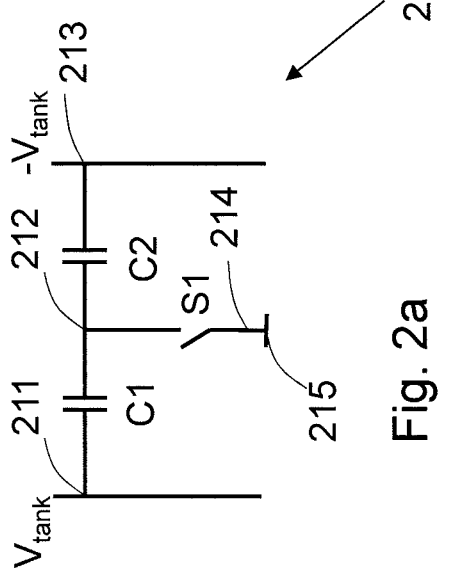
FIGS. 2a and 2b are schematic views illustrating switched capacitor arrangements according to embodiments herein.

FIG. 2a shows a switched capacitor arrangement 200 according to one embodiment for tuning a differential circuit, e.g. tuning the frequency of a DCO. The switched capacitor arrangement 200 comprises a first node 211, a second node 212 and a third node 213. The switched capacitor arrangement 200 further comprises a first capacitor C1 coupled between the first node 211 and the second node 212, a second capacitor C2 coupled between the second node 212 and the third node 213, and a first switch branch comprising a first switch S1 coupled between the second node 212 and a signal ground node. The first switch S1 has an on state and an off state. The first node 211 and third node 213 are configured to be connected to respective differential nodes Vtank, −Vtank of the differential circuit and the switched capacitor arrangement 200 is configured to tune the differential circuit by controlling the state of the first switch S1.

Figure 2B:
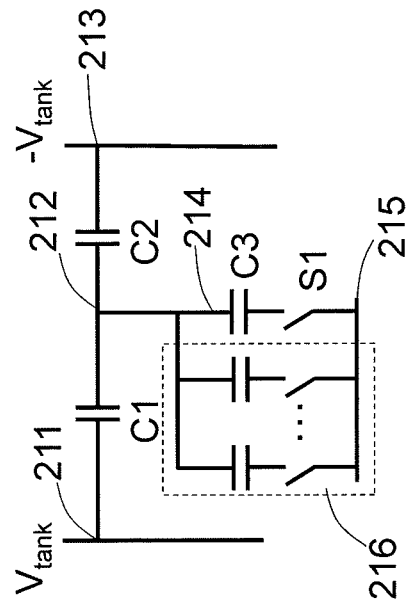
Figure 2C:
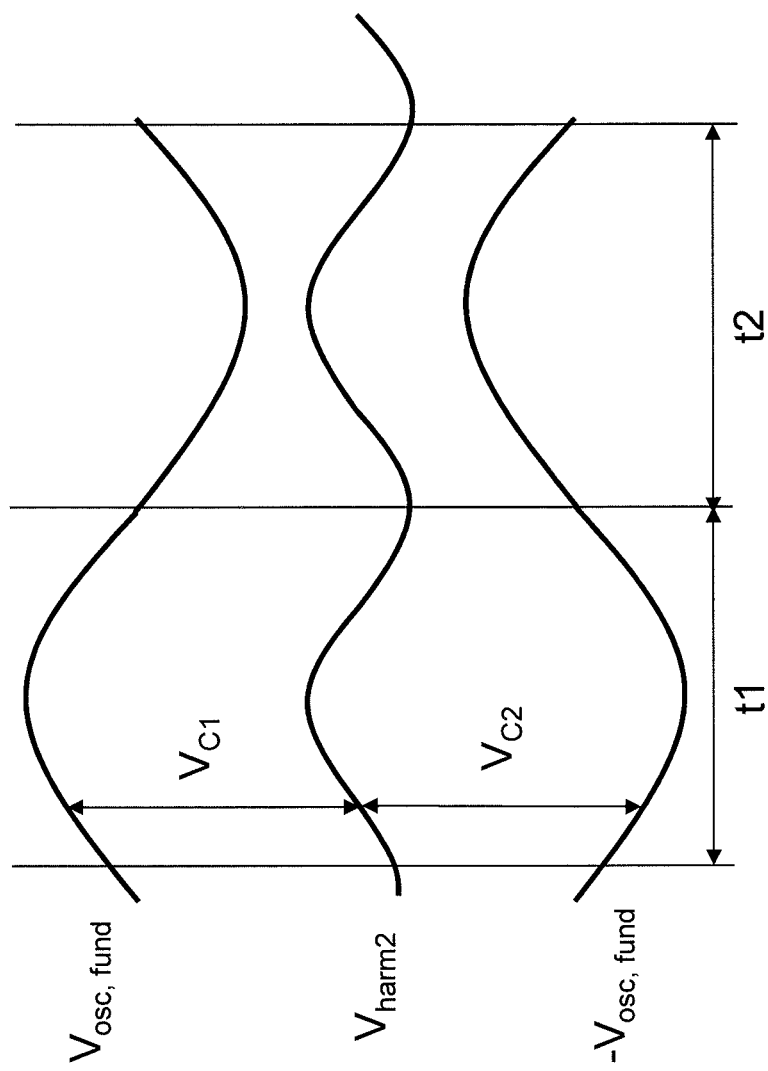
FIG. 2c are waveforms showing the fundamental and the $2^{nd}$ harmonic waveforms.

This tuning technique has an advantage that equal size capacitors may be used, i.e. the first capacitor C1 and the second capacitor C2 may have same capacitance. Therefore better matching may be achieved. This technique relies on even order harmonic contents of the waveforms from the differential circuit for the tuning mechanism. Having equal sized capacitors, only common-mode voltages will be present at the middle node 212. With the first switch S1 open, the voltage at the middle node 212 will be dominated by the second order harmonic. The effective capacitance will be the series connection of the two capacitors C1 and C2, i.e. equal to C1/2. When the first switch S1 in FIG. 2a is closed, the voltage Vc1 and Vc2 across the capacitors C1 and C2 will no longer be equal, due to the second order harmonic voltage. This is shown in FIG. 2c, where the fundamental waveforms for the differential nodes 211, 213 and the $2^{nd}$ harmonic waveform at the middle node 212 are shown.

When the switch is closed the second harmonic common mode voltage will be added to the capacitor voltages. As can be seen in FIG. 2c, the second harmonic will be "in phase" with the positive oscillator fundamental voltage in the first half period t1. The signal voltage across the first capacitor C1 will then be reduced, resulting in less stored energy. The voltage across the second capacitor C2 will instead become larger, with increased stored energy. In the second half period t2, it is the other way around, with the first capacitor C1 storing more energy, and the second capacitor C2 less. Due to the quadratic dependence of capacitive energy to voltage, the increase of energy in one capacitance will be larger than the corresponding decrease of the other, resulting in a total net increase of energy in the capacitors when the first switch S1 is closed. As described in J. Groszkowski, "*The interdependence of frequency variation and harmonic content, and the problem of constant-frequency oscillators*", Proc. of the IRE, vol. 21, pp. 958-981, 1933, when the energy is increased in the capacitance of an LC-resonator due to harmonics, the energy must be increased in the inductance to maintain the balance, and this will cause the frequency of oscillation to reduce. This is usually referred to as the Groszkowski effect, i.e. a shift in oscillation frequency induced by higher harmonics current flowing into the LC tank of a harmonic oscillator. The tuning mechanism may thus be explained by second order harmonic signal being switched into a programmable fraction of the capacitive part of the resonator, which due to the Groszkowski effect causes a reduction of the oscillation frequency.

According to some embodiments, the first switch branch may further comprise a third capacitor C3 coupled in series with the first switch S1. This is shown in FIG. 2b. When the first switch S1 in FIG. 2b is closed, the second harmonic current will flow in C3 as well as C1 and C2. The amount of second harmonic current in C1 and C2 will be proportional to C3 for small values of C3. This provides a new degree of freedom in setting the tuning sensitivity.

According to some embodiments, the switched capacitor arrangement 200 may further comprise a plurality of switch branches coupled between the second node 212 and the signal ground node, wherein each switch branch comprises a capacitor coupled in series with a switch, as shown in FIG. 2b dotted line box. The capacitor in each switch branch may have same capacitance or some capacitors in some switch branches may have different capacitance. This embodiment may provide different tuning capacitances and resolutions depending on different combinations of the capacitors in the plurality of switch branches In the following, embodiments using two capacitors of nearly equal size series connected between the positive and negative voltages of the differential circuit as capacitive voltage divider will be described.

FIG. 3a shows a switched capacitor arrangement 300 according to one embodiment for tuning a differential circuit, e.g. tuning the frequency of a DCO. The switched capacitor arrangement 300 comprises a first capacitor branch 310. The first capacitor branch 310 comprises a first node 311, a second node 312 and a third node 313. The first capacitor branch 310 further comprises a first capacitor 314 coupled between the first node 311 and the second node 312, a second capacitor 315 coupled between the second node 312 and the third node 313.

The switched capacitor arrangement 300 further comprises a second capacitor branch 320. The second capacitor branch 320 comprises a first node 321, a second node 322 and a third node 323. The second capacitor branch 320 further comprises a third capacitor 324 coupled between the first node 321 and the second node 322, a fourth capacitor 325 coupled between the second node 322 and the third node 323.

The switched capacitor arrangement 300 further comprises a first switch branch comprising a first switch S1 coupled between the second nodes 312, 322 of the first and second capacitor branches.

The first switch S1 has an on state and an off state. The first nodes 311, 321 and the third nodes 313, 323 of the first and second capacitor branches are configured to be connected to respective differential nodes of the differential circuit. The switched capacitor arrangement 300 is configured to tune the differential circuit by controlling the state of the first switch S1.

According to some embodiments, the first and second capacitor branches 310, 320 may have same capacitance. A capacitance ratio of the first capacitor to the second capacitor may be $1/(1+x)$, and a capacitance ratio of the third capacitor to the fourth capacitor may be $(1+x)$, where $0<x<1$. That is if the first capacitor 314 has capacitance of C, the second capacitor 315 may have capacitance of $(1+x)$C, then the third capacitor 324 may have capacitance of $(1+x)$C, and the fourth capacitor 325 may have capacitance of C, or other way around.

When the first switch S1 is on, the capacitance across the differential nodes is $$C_{on} = \frac{1}{2}[C + (1+x)C] = C\left(1 + \frac{x}{2}\right) \quad (1)$$

When the first switch S1 is off, the capacitance across the differential nodes is $$C_{off} = 2 \cdot \frac{C(1+x) \cdot C}{C(1+x) + C} = C \cdot \frac{2 + 2x}{2 + x} = C \cdot \left(1 + \frac{x}{2} - \frac{x^2}{2(2+x)}\right) \quad (2)$$

So the capacitance difference is $$C_{on} - C_{off} = C \cdot \frac{x^2}{2(2+x)} \approx C \cdot \left(\frac{x}{2}\right)^2 \quad (3)$$

That is the difference in differential tank capacitance between the switch being on and off becomes approximately $$C \cdot \left(\frac{x}{2}\right)^2.$$

Different tuning sensitivities may be obtained by different values of C and x.

According to some embodiments, the first switch branch may further comprise two capacitors $Cs_1$, $Cs_2$ in series with the first switch S1. As shown in FIG. 3b, one capacitor $Cs_1$ may be coupled between the second node 312 of the first capacitor branch 310 and the first switch S1, and another capacitor $Cs_2$ may be coupled between the second node 322 of the second capacitor branch 320 and the first switch S1.

According to some embodiments, the first switch branch may further comprise a capacitor Cs in series with the first switch S1. That is the two capacitors $Cs_1$, $Cs_2$ shown in FIG. 3b may be combined as one capacitor Cs and connected in series with the first switch S1.

In these embodiments, when the first switch S1 is off, the capacitance across the differential nodes is the same as in equation (2).

When the first switch S1 is on, assume Cs has capacitance of Ct, or each of the two capacitors $Cs_1$, $Cs_2$ has capacitance of 2Ct, the capacitance to signal ground of the first capacitor branch 310 at node 311 is $$C_{311} = C \cdot \left(1 + \frac{xC}{2C_t + 2C + xC}\right) \quad (4)$$

The capacitance to signal ground of the second capacitor branch 320 at node 321 is $$C_{321} = C \cdot (1+x)\left(1 - \frac{xC}{2C_t + 2C + xC}\right) \quad (5)$$

So the capacitance across the differential nodes is $$C_{on} = \frac{1}{2}C_{311} + \frac{1}{2}C_{321} = C \cdot \left(1 - \frac{x^2}{2} \cdot \frac{C}{2C_t + 2C + xC} + \frac{x}{2}\right) \quad (6)$$

So the capacitance difference is $$C_{on} - C_{off} = C_t \cdot \frac{x^2}{(2+x)\left(2+x+\frac{2C_t}{C}\right)} \approx C_t \cdot \left(\frac{x}{2}\right)^2 \quad (7)$$

It can be seen that the effective switched capacitance has been reduced by a factor of $x^2/4$, compared to direct connection of a switched capacitor with capacitance Ct at the differential nodes. By making x small, very small capacitance steps may be achieved. Therefore tuning resolution may be increased and tuning sensitivity may be reduced without using very small capacitors. For example, if x is equal to 0.2, the tuning sensitivity is thus reduced to 1%.

According to some embodiments, the switched capacitor arrangement 300 may further comprise a plurality of switch branches coupled between the second nodes 312, 322 of the first and second capacitor branches. Each switch branch may comprise one or two capacitors connected in series with a switch, as shown in FIG. 3b dotted line box.

Depending on different requirements on tuning range and tuning sensitivity, the capacitance of each switch branch may be chosen differently. For example, different switch branches may have same capacitance or different capacitance, or some switch branches may have same capacitance and some switch branches may have different capacitance. The two capacitors in each switch branch may have same capacitance.

According to some embodiments, the first switch S1 in the switch branches may be implemented by switching transistors, such as metal oxide semiconductor field effect transistors (MOSFET/MOS).

To investigate the frequency tuning techniques according to embodiments herein, a DCO for a 5G frequency synthesizer has been simulated in a 28 nm CMOS SOI design-kit for different attenuations, i.e. the attenuation parameter x is 0.1, 0.2, 0.3, 0.4. The tuning sensitivity responds as expected when changing x. The effective tuning capacitance being proportional to the square of the attenuated voltage gives a large dynamic range in sensitivity programmability. For example, when x=0.1, the sensitivity=0.040 MHz/fF, when x=0.2, the sensitivity=0.12 MHz/fF, when x=0.3, the sensitivity=0.29 MHz/fF, when x=0.4, the sensitivity=0.49 MHz/fF.

The embodiments herein are based on using capacitive voltage dividers across a differential resonator of a differential circuit. To achieve minimum tuning sensitivity, the voltage division capacitors, e.g. the first and second capacitors 314, 315 and the third and the fourth capacitors 324, 325 in the switched capacitor arrangement 300 shown in FIG. 3b, may be chosen to be a bit larger than e.g. minimum sized capacitor, for best matching. The switched capacitor banks, i.e. the plurality of switch branches coupled between the second nodes 312, 322 of the first and second capacitor branches 310, 320 may then be subjected to a very small voltage. The accuracy of this small voltage is limited only by the voltage division capacitor matching, and matching of capacitors is typically very good on chip. By using minimum sized capacitors for Ct, Cs1, Cs2 for minimum frequency step, it may therefore be possible to create accurate attenuations in the order of 1% of the signal voltage, corresponding to about 10000 times reduction of the capacitance step size. Further, large size voltage division capacitors will also provide good tuning linearity.

To summarise the discussions above, some advantages of the switched capacitor arrangements 200, 300 according to embodiments herein include:

Firstly, for the capacitor arrangement 300, since the switched capacitor arrangement is coupled to respective differential nodes of a differential circuit, i.e. not using any other nodes, e.g. source terminals of a cross coupled differential pair of transistors in the differential circuit, which would introduce dependence on transistor parameters, the capacitive attenuation technique according to embodiments herein is completely independent on transistor parameters when setting the attenuation level and controlling the tuning sensitivity. That is a well-controlled reduction of the tuning sensitivity may be achieved.

Secondly, if two capacitors of equal size or nearly equal size are series connected between the differential nodes with positive and negative voltages of the resonator, the middle node of the two series connected capacitors will have a signal voltage close to zero. Therefore small signal voltages may be achieved without the need for large capacitor ratios. The second harmonic tuning technique shown in FIGS. 2a and 2b has the advantage of using equal sized capacitors in the voltage divider which increases matching accuracy.

Thirdly, the requirements on the switch may be considerably relaxed compared to switching a capacitance in a regular structure, i.e. direct connection of a switched capacitor across the differential nodes of the circuit, where the switch is in series with the capacitor. Since the voltage on the middle node is close to zero, the switch connected to the middle node according to embodiments herein will have considerable much less signal current flow, i.e. 1/x times less, in its on-state compared to the switch in the regular structure. The on-resistance may thus be higher, e.g. $1/x^2$ times higher, in the switch for the same capacitance quality factor. A good compromise may be achieved by multiplying the regular structure switch width by x to find a good balance between off-state parasitic capacitance, on-state quality factor, and chip area.

Fourthly, very fine capacitance step can be achieved while still using a limited range of capacitor sizes, i.e. not smaller than existing capacitors in a design-kit, and not very large to save chip area. Without using extreme component values which pose hard component requirements, effective capacitance steps of less than 1% of the minimum capacitor of the current technology may be achieved. This corresponds to more than 100 times increased capacitance resolution compared to a regular structure. In fact, the switched capacitor arrangements 200, 300 according to embodiments herein using the capacitive attenuation technique optimized for capacitance resolution may be able to reach robust attenuation levels of about 1%, corresponding to 10000 times increased capacitance resolution. Very fine capacitance step results in very fine frequency resolution.

Figure 4:
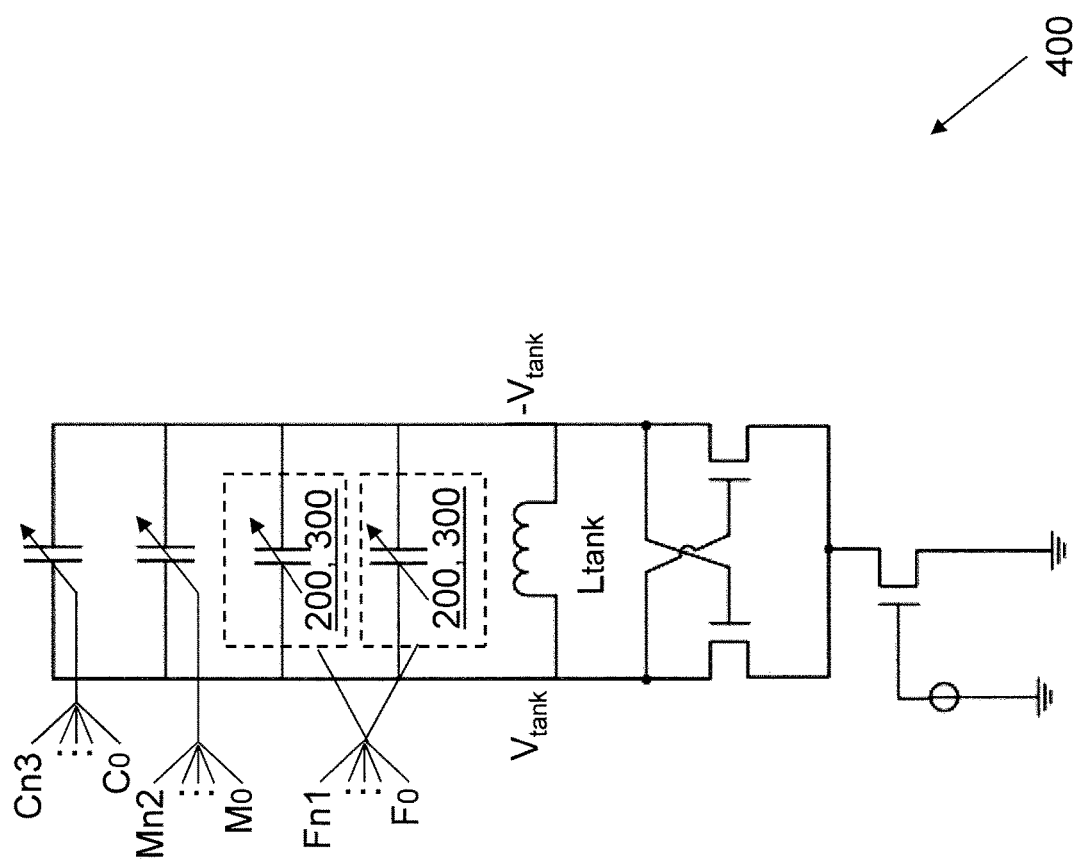
FIG. 4 is a schematic block view illustrating a differential circuit in which embodiments herein may be implemented.

The switched capacitor arrangements 200, 300 according to embodiments herein are suitable for tuning of a differential circuit 400, as shown in FIG. 4. The differential circuit 400 may be any one of a DCO, a digital to time converter or a digitally controlled filter comprised in any electronic devices. For example, the switched capacitor arrangements 200 may be used to tune the frequency of a DCO, or the delay of a digital to time converter. The switched capacitor arrangement 300 may be used to tune the frequency of a DCO, the frequency of a differential digitally controlled filter, or the delay of a digital to time converter.

The differential circuit 400 may comprise one or a plurality of switched capacitor arrangement 200, 300, for fine tuning the differential circuit 400 controlled by digital control words F0, . . . Fn1. The differential circuit 400 may comprise coarse tuning and medium tuning controlled by respective digital control words C0, . . . Cn3, M0, . . . Mn2 as in any prior art solutions.

In each switched capacitor arrangement of the plurality of switched capacitor arrangement 300, a capacitance ratio of the first capacitor to the second capacitor may be 1/(1+x), and a capacitance ratio of the third capacitor to the fourth capacitor may be (1+x), where 0<x<1. The attenuation parameter x may be different for each switched capacitor arrangement 300 or may be same for some of the switched capacitor arrangements 300.

Figure 5:
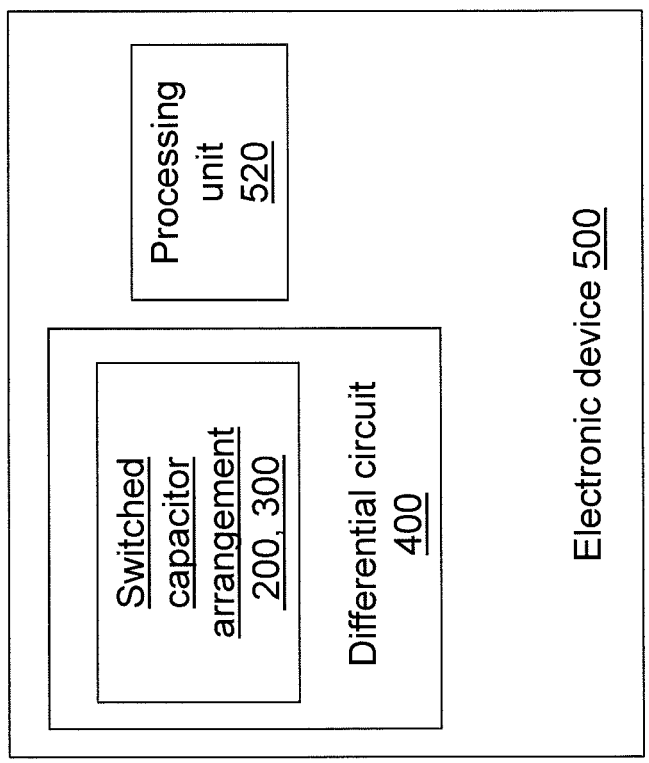
FIG. 5 is a block diagram illustrating an electronic device in which embodiments herein may be implemented.

FIG. 5 shows an electronic device 500 which comprises a differential circuit 400 in which the switched capacitor arrangements 200, 300 according to embodiments herein may be implemented. The electronic device 500 may be any one of a wireless communication device, a base station, a mobile terminal, a wireless transceiver, a frequency synthesiser etc. The electronic device 500 may comprise other units, e.g. a processing unit 520 for generating digital control words and signal processing etc.

When using the word "comprise" or "comprising" it shall be interpreted as non-limiting, i.e. meaning "consist at least of".

Also note that terminology such as a first capacitor and a second capacitor should be considered to be non-limiting and does in particular not imply a certain hierarchical relation between the two.

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. A switched capacitor arrangement for tuning a differential circuit, the switched capacitor arrangement comprising:
a first capacitor branch, wherein the first capacitor branch comprises:
a first node, a second node, and a third node;
a first capacitor coupled between the first node and the second node; and
a second capacitor coupled between the second node and the third node;
a second capacitor branch, wherein the second capacitor branch comprises:
a first node, a second node, and a third node;
a third capacitor coupled between the first node and the second node; and
a fourth capacitor coupled between the second node and the third node; and
a first switch branch comprising a first switch coupled between the second nodes of the first and second capacitor branches, wherein:
the first switch has an on state and an off state;
the first nodes and the third nodes of the first and second capacitor branches are configured to be connected to respective differential nodes of the differential circuit;
the switched capacitor arrangement is configured to tune the differential circuit by controlling the state of the first switch; and
the first and second capacitor branches have a same capacitance,
wherein a capacitance ratio of the first capacitor to the second capacitor is 1/(1+x), and a capacitance ratio of the third capacitor to the fourth capacitor is (1+x), where 0<x<1.

2. The switched capacitor arrangement according to claim 1, wherein the first switch branch further comprises two capacitors in series with the first switch, and wherein one capacitor of the two capacitors is coupled between the second node of the first capacitor branch and the first switch, and another capacitor of the two capacitors is coupled between the second node of the second capacitor branch and the first switch.

3. The switched capacitor arrangement according to claim 1, further comprising a plurality of switch branches coupled between the second nodes of the first and second capacitor branches, wherein each switch branch comprises one or two capacitors connected in series with a switch.

4. The switched capacitor arrangement according to claim 1, wherein the first switch is implemented by metal oxide semiconductor (MOS) transistor.

5. The differential circuit comprising one or a plurality of switched capacitor arrangements according to claim 1.

6. The differential circuit according to claim 5, wherein in each switched capacitor arrangement, a capacitance ratio of the first capacitor to the second capacitor is 1/(1+x), and a capacitance ratio of the third capacitor to the fourth capacitor is (1+x), where 0<x<1, and wherein x is different for said each switched capacitor arrangement or is same for some of the switched capacitor arrangements.

7. The differential circuit according to claim 5, comprising any one of a differential Digital Controlled Oscillator, a digital to time converter, and a differential digitally controlled filter.

8. An electronic device comprising the differential circuit according to claim 6.

9. The electronic device according to claim 8, comprising any one of a wireless communication device, a base station, a mobile terminal, a wireless transceiver, and a frequency synthesizer.

* * * * *